(12) United States Patent
Kimura et al.

(10) Patent No.: US 6,953,714 B2
(45) Date of Patent: Oct. 11, 2005

(54) THIN FILM SEMICONDUCTOR DEVICE HAVING ARRAYED CONFIGURATION OF SEMICONDUCTOR CRYSTALS AND A METHOD FOR PRODUCING IT

(75) Inventors: Yoshinobu Kimura, Yokohama (JP);
Masakiyo Matsumura, Yokohama (JP);
Mikihiko Nishitani, Yokohama (JP);
Masato Hiramatsu, Yokohama (JP);
Masayuki Jyumonji, Yokohama (JP);
Yoshitaka Yamamoto, Yokohama (JP);
Hideo Koseki, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 66 days.

(21) Appl. No.: 10/293,939

(22) Filed: Nov. 14, 2002

(65) Prior Publication Data

US 2003/0132439 A1 Jul. 17, 2003

(30) Foreign Application Priority Data

Nov. 19, 2001 (JP) .......................... 2001-390619

(51) Int. Cl.[7] .......................... H01L 21/00; H01L 21/84
(52) U.S. Cl. ...................... 438/149; 438/162; 438/164; 438/166
(58) Field of Search .............................. 438/149, 151, 438/153–154, 161–162, 164, 166, 487, 517

(56) References Cited

U.S. PATENT DOCUMENTS 5,306,651 A 4/1994 Masumo et al.
5,681,759 A * 10/1997 Zhang .......................... 438/162
5,953,597 A * 9/1999 Kusumoto et al. .......... 438/161

FOREIGN PATENT DOCUMENTS

JP 62-35571 2/1987
JP 63-102265 5/1988

* cited by examiner

Primary Examiner—Phat X. Cao
Assistant Examiner—Theresa T. Doan
(74) Attorney, Agent, or Firm—Morrison & Foerster LLP

(57) ABSTRACT

A method for producing a thin film semiconductor device is described. In the method, a thin film layer of non-single-crystalline semiconductor, which is deposited on a base layer of glass, is processed to an island-shaped thin film layer at the time prior to the layer irradiation step. The laser irradiation to the thin film layer of non-single-crystalline semiconductor is carried out after forming an insulation film layer and a gate electrode over the island-shaped thin film layer, by using the gate electrode as the irradiation mask, whereby the center area of the island-shaped thin film layer masked by the gate electrode is crystallized, and simultaneously, the both side areas thereof which is not masked by the gate electrode are annealed. Next, a source electrode and a drain electrode is formed in the annealed areas. The implantation of impurity ion may be carried out either before or after the laser irradiation. By the above order of steps, it becomes possible to obtain a thin film semiconductor device which has small numbers of crystals and less variance of grain size of crystals for each unit of electric circuit, compared with a device produced by the conventional process. Further, the process makes it possible to be even the boundary surface between the crystallized layer and the insulation layer in a device.

9 Claims, 3 Drawing Sheets

THIN FILM SEMICONDUCTOR DEVICE HAVING ARRAYED CONFIGURATION OF SEMICONDUCTOR CRYSTALS AND A METHOD FOR PRODUCING IT

BACKGROUND OF THE INVENTION

The present invention relates to a thin film semiconductor device and a semiconductor substrate sheet to be used in the semiconductor device as well as a method for producing them.

As is well known, a thin film semiconductor device also known as a thin film transistor (TFT) device) is formed on a semiconductor substrate, which typically consists of a thin film layer of semiconductor material, such as silicon, over a base layer of insulation material, such as non-alkaline glass, or quarts glass. In the thin film layer of the semiconductor, a plurality of channels interposed between of a source area and a drain area are formed, and each of channels is equipped with a gate electrode separated by an insulation film from the above areas.

FIGS. 4(a) to 4(e) show a typical conventional process for producing a TFT, which includes the following steps. Those steps are forming a thin film layer (202) of non-single-crystalline semiconductor material such as silicon over the base layer (201) of insulation material such as glass as shown in FIG. 4(a), crystallizing the semiconductor layer (202) by irradiation of energy beam (203) such as excimer laser as shown in FIG. 4(b), processing the crystallized semiconductor layer (204) to form an "island" (205) and forming a gate insulation film (206) of insulation material such as silicon oxide ($SiO_2$) as shown in FIG. 4(c), forming a gate electrode (207) on the gate insulation film and implanting impurity ion (208) such as phosphorous ion into the crystallized semiconductor layer (204) by using the gate electrode (207) as the implantation mask as shown in FIG. 4(d), and forming an activated source area (209) and a drain area (210) as well as a channel area (211) interposed therebetween, forming contact holes upon the source area and the drain area, and forming a source electrode (212) and a drain electrode(213) as shown in FIG. 4(e).

One of disadvantages of the above typical conventional process is that the grain size of crystallized semiconductor becomes variant and, as the result thereof, the number of grain boundaries crossing a channel area becomes also variant at every one-unit channel areas.

Such variance of the number of grain boundaries crossing each channel area tends to cause the variance of characteristics of each TFT such as mobility and operation threshold voltage. When representing the channel length by "Lg" and representing the gran size by "φ", it is possible to make the variance of TFT characteristics to be not so noticeable in the case of "φ/Lg<<1". However, the variance of TFT characteristics become noticeable according to the increase of "φ/Lg" in case of "φ/Lg>⅕". For instance, in case of producing a standard size TFT having a channel size of about $5\mu \times 5\mu$, when a polysilicon thin film consisting of crystal grains having such variance of grain size as from 1 $\mu m$ to several tens micron millimeters, the number of grain boundaries running in the source/drain direction vary in the order of "0~5", which causes inevitably a noticeable variance of TFT characteristics.

Furthermore, a semiconductor thin film produced by the foregoing conventional process, it is inevitable that a mountain-shaped projection is formed at the triple-contact point of grain boundaries owing to the crystallization by annealing with laser irradiation. The height of such projection may be 30~80 nm in case of forming a polysilion thin film of 50 nm thickness. The existence of such projection tends to make the interface between the gate insulation film and the semiconductor film to be uneven, which in turn tends to cause the degradation of mobility due to scattering of careers at the interface or to cause performance degradation due to the concentration of electric field at the end.

One possible way for avoiding the above disadvantages is to increase the thickness of the gate insulation film to the degree of about 100 nm. But, this way may cause to degrade the level of ON-state electric current. The increase of thickness may further cause to make the activation rate by implantation of impurities to source/drain area to be variant, which in turn causes the variance of electrode resistance, owing to the segregation of atoms of impurities to the grain boundaries.

Many trials have been made for the purpose of increasing of grain size or avoiding variance of grain size, without changing the order of steps in the foregoing conventional process. For instance, the inventors of the present invention have proposed a new method for producing a thin film semiconductor device by the U.S. patent application Ser. No. 10/19285, in which it is proposed to carry out the irradiation of energy beam in a distribution of irradiation strength in such manner as decreasing the beam strength successively from the maximum to the minimum in a predetermined area, thereby to obtain a thin film semiconductor device having crystal grains of even size in a regulated configuration is obtained.

The inventors of the present invention have intended to develop a new process, which, without being confined to the order of steps in the conventional process, makes it possible to obtain a thin film semiconductor device in which large size crystal grains are arranged regulatedly at the position corresponding to every unit channels.

SUMMARY OF THE INVENTION

It is an object of the present invention to provide a thin film semiconductor, in which large size crystal grains are arranged in a regulated configuration at each channel area and the interface between a gate insulation film and a crystallized semiconductor layer is even, as well as a method for producing such device, which can make it possible to obtain the above device efficiently by employing the order of steps which is different from the order of steps in the conventional process, especially different in the order of step for carrying out the crystallization. Namely, in the method for producing a thin film semiconductor device of the invention, the step for forming a gate electrode, which has been carried out in a latter stage of the process in the conventional process, is carried out in an early stage of the process.

The present invention includes a method for producing a thin film semiconductor device comprising the steps of; (a) forming a plurality of island-shaped thin film layer of non-single-crystalline semiconductor on a base layer of insulation materials, (b) forming an insulation film layer which covers the the island-shaped thin film layer, (c) forming a gate electrode at an upper position corresponding to the island-shaped thin film layer, (d) irradiating the island-shaped thin film layer of non-single-crystalline semiconductor layer with laser beam from the upper direction by using the gate electrode as the irradiation mask, thereby forming a channel area by crystallizing the center portion of the island-shaped thin film layer which is masked by the gate electrode, and simultaneously, forming a source area and a drain area by annealing the both side portions of the island-shaped thin film layer which is not masked by the gate electrode, and (e) forming a source electrode and a drain electrode on the source area and the drain area, after forming contact holes in the insulation film layer.

Further, the present invention provides a thin film semiconductor device including a base layer of an insulation material, a thin film semiconductor layer formed on the base layer, in which a source area, a drain electrode area and a channel area are formed, a gate electrode formed above the channel area, said channel area being crystallized by the irradiation of laser bean from the upper direction by using the gate electrode as the irradiation mask.

According to the process of the present invention, in which the laser irradiation is carried out by using the gate electrode as the irradiation mask, it is possible to make the heating temperature for channel area to be a temperature suited for forming a large size crystal grain, and simultaneously, to make the heating temperature of the other area to make the temperature to be suited for activation for forming source area and drain area, by way of such simplified means as to carrying out the irradiation at a condition where the portion to be a channel area in the non-single-crystalline semiconductor film layer is masked by the gate electrode. Thus, the crystallization of semiconductor to a large size crystal grain in the channel area and the activation of source/drain areas is accomplished simultaneously, under the simplified process and the low cost.

The process of the present invention makes it possible to reduce the numbers of crystal grain boundaries in a channel area and the variance of such numbers at every channel areas, whereby, it is easy to obtain a TFT, which has significantly reduced variance of mobility or operation threshold voltage.

The process of the present invention makes it possible to reduce the roughness of the surface of the crystallized layer due to the existence of projection at the grain boundaries and to make the interface between the crystallized layer and the gate insulation film layer to be even, thereby to make it possible to reduce the thickness of the gate insulation film and to prevent dispersion of careers at the interface area. Therefore, it becomes possible to obtain a TFT, which has a high mobility or high ON-state current.

The process of the present invention makes it possible to reduce the cost for irradiation significantly through carrying out the irradiation by the way of spot-irradiation targeted to the island -shaped thin film layer.

The process of the present invention makes it possible to use polysilicon as the material for forming the gate electrode, instead of using expensive material such as tungsten, thereby to reduce the cost of process remarkably.

DETAILED DESCRIPTION OF THE INVENTION

Figure 1A:
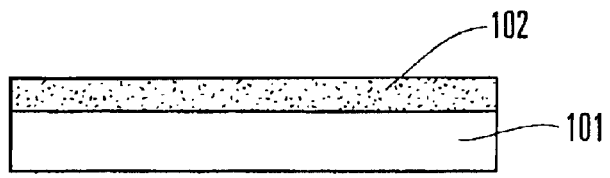
FIGS. 1(a)–1(e) show steps of an embodiment of the process according to the present invention for producing a thin film semiconductor device.

In the process for producing a thin film semiconductor device according to the present invention, the steps forming a thin film layer of non-single-crystalline semiconductor and processing it to an "island" may be carried out according to an usual way. Namely, semiconductor materials such as silicon (Si), germanium (Ge) or SiGe are deposited (102) on a base layer (101) consisting of a thin sheet of such materials as silicate glass, quartz glass, sapphires, plastic polyamide, by using such method as chemical vapor deposition or sputtering (FIG. 1(a)). It is desirable to make its thickness to be less than 60 nm. The thin film layer of non-single-crystalline semiconductor may be either a deposited layer of amorphous semiconductor or a layer of semiconductor in which small size crystals have been already formed.

Then, in the above semiconductor thin film layer, a large number of islands (105) are formed by using the method such as etching. The size of each island is usually about 30×10 $\mu$m.

Figure 1B:
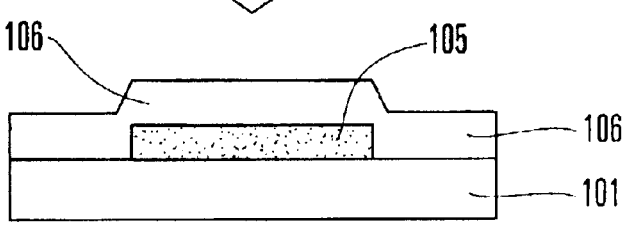

After forming the islands, an insulation film layer (106) is deposited in such mode as covering the islands (FIG. 1(b)). FIG. 1(b) shows only one island and vicinity thereof for the purpose of illustration. As the material for forming the insulation film layer, silicon oxide ($SiO_2$) is usually used and as the method for depositing such material, a plasma chemical vapor phase deposition with tetra-ethyl-ortho-silicate (TEOS) or oxygen $O_2$ may be used.

Figure 1C:
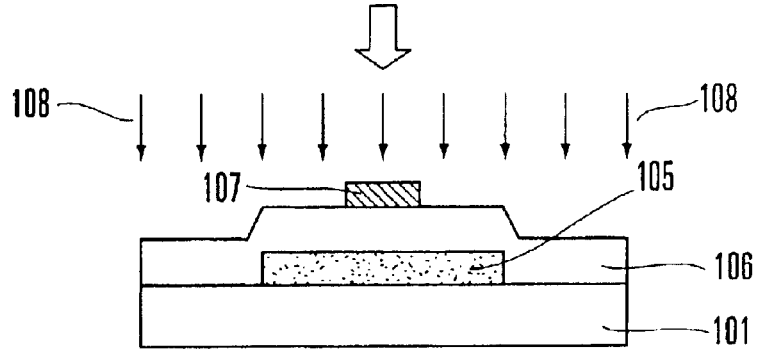

A gate electrode (107) is formed on the insulation film layer following the deposition of the insulation material, at the stage where the island—shaped film layer of non-single-crystalline semiconductor covered by the insulation material is not yet annealed (FIG. 1(c)).

The gate electrode is formed with such materials as aluminum, polysilicon (p—Si) doped with phosphorus at high concentration, tungsten (W), TiW, $WSi_2$ and $MoSi_2$. The gate electrode is formed at an upper position corresponding to an approximately center portion in the island of non-single-crystalline semiconductor film layer, so as to form two kinds of portions in the island-shaped thin film layar, namely, a center portion which is masked by the gate electrode and a side portion which is not masked by the gate electrode, at the stage of irradiation.

Figure 2A:
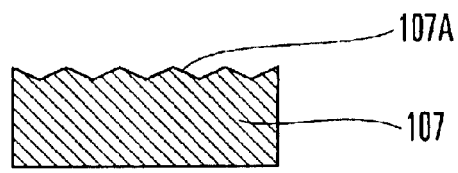
FIGS. 2(a) and 2(b) show cross-sectional views of the gate electrode of the thin film semiconductor device produced according to the present invention.
Figure 2B:
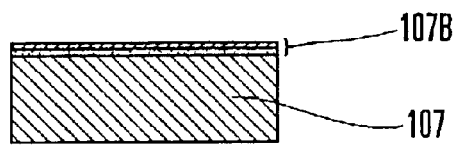

It is desirable that the gate electrode can absorb and transmit the laser beam to some extent without reflecting it completely so that some volume of laser bean can reach the channel area portion of the island-shaped thin film layer and that an annealing condition becomes suitable for crystallization for obtaining a large size crystal. For the above purpose, it is preferred to make the surface (107A) of the gate electrode (107) to be uneven (FIG. 2(a)) or to form a multi-layered film (107B) on the surface of the gate electrode.

A polysilicon film doped with impurity such as phosphorous can be used as the material of the gate electrode. In the conventional process, if polysilicon is used as the material for forming a gate electrode, a glass sheet cannot be used as the base insulation layer, as the annealing step should be carried out at a high temperature of about 900° C. in a furnace. However, as it is unnecessary to use such high temperature in the process of the present invention, polysilicon can be used as the material for the gate electrode, thereby to make it unnecessary to use expensive material such as tungsten even when a glass sheet is used as the base layer.

Figure 1D:
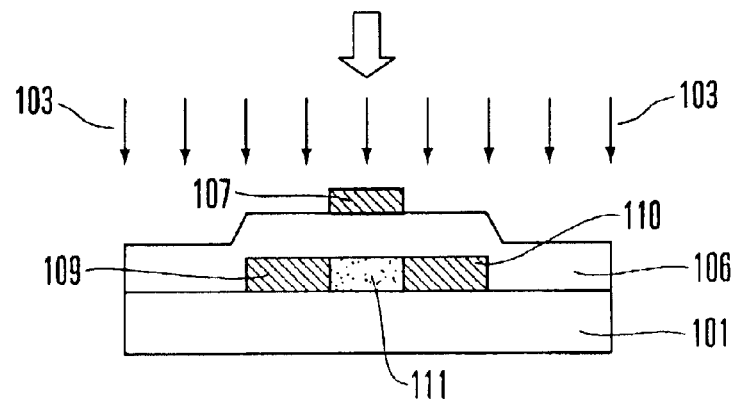
Figure 1E:
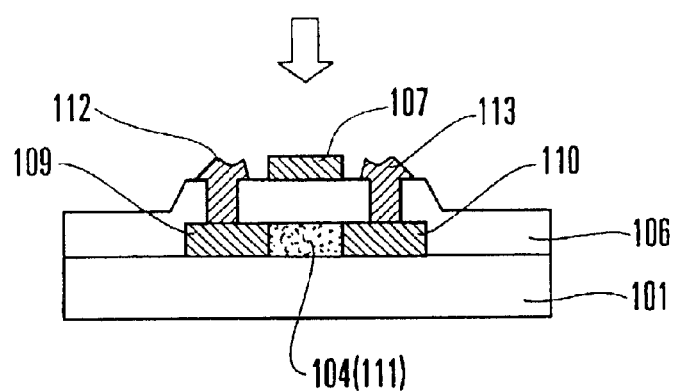

Following the formation of the gate electrode, the irradiation of energy beam such as laser beam (103) is carried out from the upper direction (FIG. 1(d)), whereby the thin film layer of non-single-crystalline semiconductor is subjected to crystallization by annealing. At that time, the central portion (namely, channel area) of the island which is masked by the gate electrode is exposed to the irradiation beam which is weaker than the irradiation beam projected to the side portions of the island (namely, source/drain areas) which are not masked by the gate electrode.

As the result, both of the side portions become a layer of micro size crystal grains by being subjected to a strong annealing action. On the other hand, pieces of crystal are nucleated in the channel area and grow up to crystal grains of large size due to the weakened annealing action. The implantation of impurity ions (108) to the island-shaped thin film layer may be carried out either before or after the irradiation of laser beam. FIG. 1(c) shows a step where the ion implantation is carried out before the laser irradiation. Impurity ions are implanted at such volume level as about $10^{15}/cm^{-2}$ of $BF_2+$ in the case of P-type TFT. By the implantation of impurity ions to the island-shaped non-single-crystalline layer, the side portions which are not masked by the gate electrode become a source area (109) and a drain area (110), and the center area which is masked by the gate electrode becomes a channel area (111).

Figure 3A:
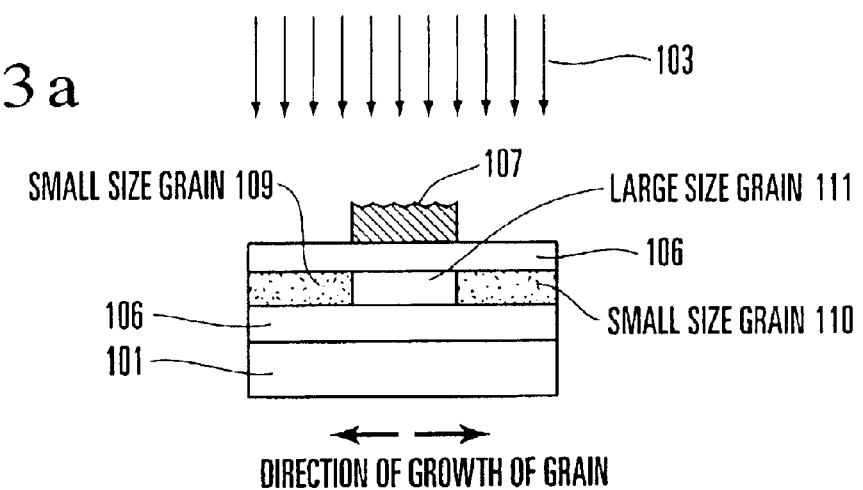
FIGS. 3(a) and 3(b) show two different laser beam intensity distributions of the irradiation process of the present invention.
Figure 3B:
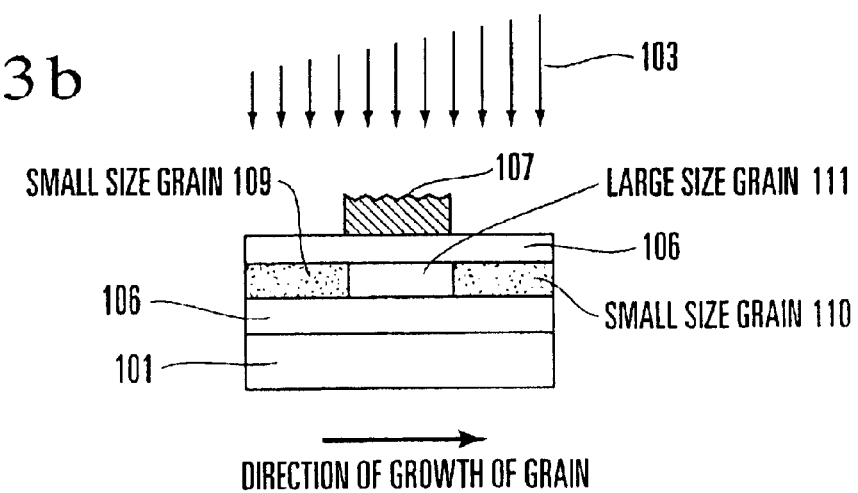
Figure 4A:
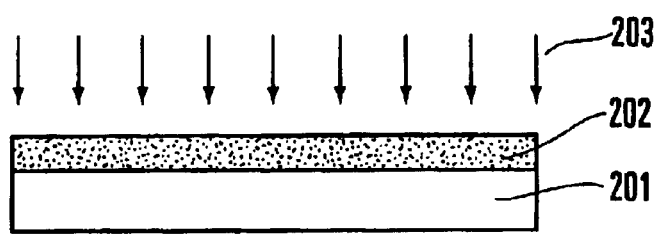
FIGS. 4(a)–4(e) show steps of a typical conventional process for producing a thin film semiconductor device.
Figure 4B:
Figure 4C:
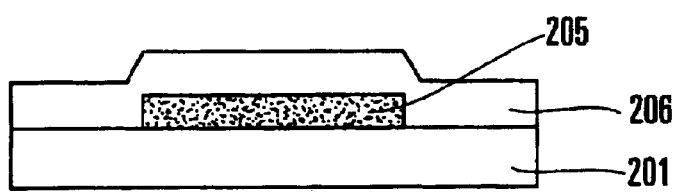
Figure 4D:
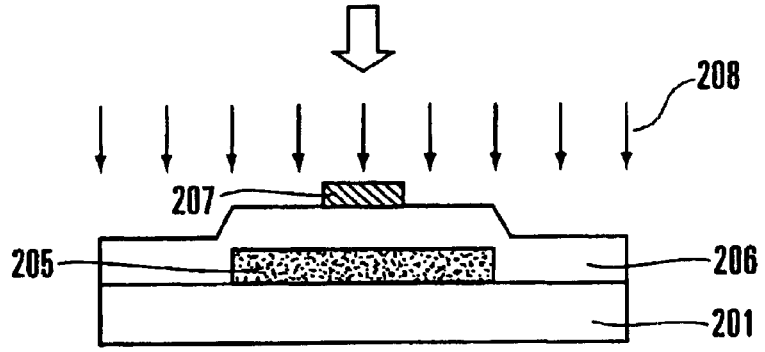
Figure 4E:
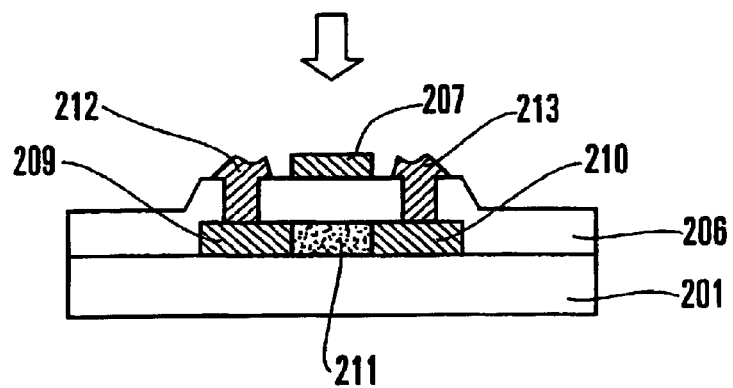

Irradiation of laser beam may be carried out toward the whole surface of a wafer, as in the conventional process. However, in the process of the present invention, the irradiation can be made only toward the island-shaped semiconductor layers and its vicinity by spot irradiation, as the semiconductor layer to be irradiated has been already processed to the island shape at the stage of irradiation. It is possible to control the formation of a crystal grain in the channel area by varying the distribution of laser beam strength. For instance, when a laser beam of uniform strength is projected toward the island-shaped layers as shown in FIG. 3(a), crystals of large grain size grow bi-directionally in the center portion of the channel area, whereby the grain boundary appears in the center of the channel area. On the other hand, when a laser beam having a gradient beam strength distribution, in which the beam strength increases or decreases from one side to another side, is projected as shown in FIG. 3(b), the crystal grains grow in the direction from one side to another side of channel area, whereby a single crystal grain of large size is formed in the channel area.

After performing the laser beam irradiation, contact holes are formed in the gate insulation film layer at the positions corresponding to the source area and the drain area. Then a source electrode and a drain electrode are formed by filling electrode material into the holes, whereby a thin film semiconductor device is completed.

What is claimed is:

1. A method for producing a thin film semiconductor device, comprising:

forming a plurality of island-shaped thin film layers of non-single-crystalline semiconductor on a base layer of an insulation material;

forming an insulation film layer which covers the island-shaped thin film layers;

forming a gate electrode on the insulation film layer at an upper position corresponding to each of the island-shaped thin film layers;

irradiating the island-shaped thin film layers of non-single-crystalline semiconductor with laser beam from above by using the gate electrode as an irradiation mask so that a center portion of each of the island-shaped thin film layers which is masked by the gate electrode is crystallized to form a channel area, and that side portions of each of the island-shaped thin film layers which are not masked by the gate electrode are annealed to form a source area and a drain area;

forming contact holes in the insulation film layer; and forming a source electrode and a drain electrode on the source area and the drain area, respectively.

2. The method for producing a thin film semiconductor device of claim 1, wherein impurity ions are implanted into the island-shaped thin film layers before the laser irradiation, the gate electrode being used as an implantation mask.

3. The method for producing a thin film semiconductor device of claim 1, wherein impurity ions are implanted into the island-shaped thin film layers after the laser irradiation, the gate electrode being used as an implantation mask.

4. The method for producing a thin film semiconductor device of claim 1, further comprising forming a thin film layer on the the gate electrode which can at least partially prevent reflection of the laser irradiation.

5. The method for producing a thin film semiconductor device of claim 1, wherein the gate electrode is formed so as to have an uneven top surface which can at least partially prevent the reflection of the laser irradiation.

6. The method for producing a thin film semiconductor device of claim 1, wherein the gate electrode comprises a polysilicon doped with impurity ions.

7. The method for producing a thin film semiconductor device of claim 1, wherein the laser irradiation is carried out by spot-irradiation targeting the island-shaped thin film layers.

8. The method for producing a thin film semiconductor device of claim 1, wherein the irradiation is carried out with a substantially uniform distribution of laser beam strength to the whole areas of the island-shaped thin film layers.

9. The method for producing a thin film semiconductor device of claim 1, wherein the irradiation is carried out with a gradient distribution of laser beam strength to the areas of the island-shaped thin film layers.

* * * * *